United States Patent
Kim et al.

(10) Patent No.: US 10,707,101 B2
(45) Date of Patent: Jul. 7, 2020

(54) SUBSTRATE TREATING APPARATUS AND SUBSTRATE TREATING METHOD

(71) Applicant: SEMES CO., LTD., Chungcheongnam-do (KR)

(72) Inventors: Heehwan Kim, Sejong-si (KR); Sul Lee, Incheon (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 12 days.

(21) Appl. No.: 15/677,321

(22) Filed: Aug. 15, 2017

(65) Prior Publication Data
US 2018/0061675 A1    Mar. 1, 2018

(30) Foreign Application Priority Data
Aug. 25, 2016  (KR) .......................... 10-2016-0108340

(51) Int. Cl.
*H01L 21/67*    (2006.01)
*H01L 21/687*    (2006.01)

(52) U.S. Cl.
CPC .... *H01L 21/6708* (2013.01); *H01L 21/67017* (2013.01); *H01L 21/67051* (2013.01); *H01L 21/68721* (2013.01); *H01L 21/68735* (2013.01)

(58) Field of Classification Search
None
See application file for complete search history.

(56) References Cited

U.S. PATENT DOCUMENTS

| | | | | |
|---|---|---|---|---|
| 6,247,479 | B1* | 6/2001 | Taniyama | B08B 3/024 134/133 |
| 2006/0081180 | A1* | 4/2006 | Aoki | H01L 21/67051 118/696 |
| 2011/0023909 | A1* | 2/2011 | Ito | H01L 21/67051 134/18 |
| 2013/0048609 | A1* | 2/2013 | Ito | H01L 21/67051 216/83 |

(Continued)

FOREIGN PATENT DOCUMENTS

| | | |
|---|---|---|
| JP | 2012054405 A | 3/2012 |
| JP | 2014209605 A | 11/2014 |
| KR | 10-2014-0089217 A | 7/2014 |

(Continued)

OTHER PUBLICATIONS

Machine Generated English Translation of KR1020160019013. Published Feb. 18, 2016 (Year: 2016).*

(Continued)

*Primary Examiner* — Sylvia MacArthur
(74) *Attorney, Agent, or Firm* — Carter, DeLuca & Farrell LLP

(57) ABSTRACT

Disclosed are a substrate treating apparatus and a substrate treating method. The substrate treating apparatus including a spin head configured to support the substrate, a nozzle configured to discharge a chemical to the substrate located on the spin head, a first passage configured to supply a first chemical, a chemical property of which is the same as the chemical, a second passage configured to supply a second chemical, a chemical property of which is the same as the first chemical, and a discharge passage connecting the first passage and the second passage, and the nozzle.

17 Claims, 3 Drawing Sheets

(56) References Cited

U.S. PATENT DOCUMENTS

2015/0093906 A1* 4/2015 Kobayashi ........ H01L 21/31111
438/748
2018/0061675 A1* 3/2018 Kim .................. H01L 21/67051

FOREIGN PATENT DOCUMENTS

KR      20160019013 A    2/2016
KR    10-2016-0027800 A  3/2016

OTHER PUBLICATIONS

Machine Generated English Translation of KR1020130089217. Published Jul. 14, 2014 (Year: 2014).*
Machine Generated English Translation of KR10-2014-0089217 abstract. Published Jul. 14, 2014 (Year: 2014).*
Machine Generated English Translation of KR10-2014-0089217 specification. Published Jul. 14, 2014 (Year: 2014).*
Machine Generated English Translation of KR10-2014-0089217 claims. Published Jul. 14, 2014 (Year: 2014).*

* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2016-0108340 filed on Aug. 25, 2016, in the Korean Intellectual Property Office, the entire contents of which are hereby incorporated by reference.

BACKGROUND

Embodiments of the inventive concept described herein relate to a substrate treating apparatus and a substrate treating method.

In general, a semiconductor device is manufactured by depositing various materials on a substrate in forms of thin films and patterning the deposited materials. To achieve this, different processes of several stages, such as a deposition process, a photographing process, an etching process, and a cleaning process are required.

Among them, the etching process is a process of removing the film formed on the substrate, and the cleaning process is a process of removing contaminants residing on a surface of the substrate after unit processes for manufacturing the semiconductor device are performed. The etching process and the cleaning process are classified into a wet type and a dry type according to process executing methods, and the wet type is classified into a batch type and a spin type.

In the spin type, a substrate is cleaned or etched by supplying a chemical or deionized water to a substrate through an ejection nozzle while the substrate is rotated after fixing the substrate to a chuck member, and by spreading the chemical or the deionized water to the entire surface of the substrate by using a centrifugal force.

SUMMARY

Embodiments of the inventive concept provide a substrate treating apparatus that may efficiently treat a substrate, and a substrate treating method.

Embodiments of the inventive concept also provide a substrate treating apparatus that may uniformly treat areas of a substrate by a chemical, and a substrate treating method.

The objects of the inventive concept are not limited to the above-described ones. Other technical objects that are not mentioned will be clearly understood from the following description by those skilled in the art to which the inventive concept pertains.

In accordance with an aspect of the inventive concept, there is provided a substrate treating apparatus including a spin head configured to support the substrate, a nozzle configured to discharge a chemical to the substrate located on the spin head, a first passage configured to supply a first chemical, a chemical composition of which is the same as the chemical, a second passage configured to supply a second chemical, a chemical composition of which is the same as the first chemical, and a discharge passage connecting the first passage and the second passage, and the nozzle.

A concentration of the first chemical may be higher than that of the second chemical.

A temperature of the first chemical may be higher than that of the second chemical.

The substrate treating apparatus may further include a first tank connected to the first passage and configured to supply the first chemical to the first passage, and a second tank connected to the second passage and configured to supply the second chemical to the second passage.

A temperature of the first chemical may be higher than a temperature of the second chemical, and the first tank may supply a larger amount of the first chemical to the nozzle when the nozzle discharges the chemical to an outer area of the substrate rather than when the nozzle discharges the chemical to a central area of the substrate.

A concentration of the first chemical may be higher than a concentration of the second chemical, and the first tank may supply a larger amount of the first chemical to the nozzle when the nozzle discharges the chemical to an outer area of the substrate rather than when the nozzle discharges the chemical to a central area of the substrate.

The substrate treating apparatus may further include a circulation passage through which the first chemical discharged from the first tank is introduced into the first tank again, and a heater located in the circulation passage.

In accordance with another aspect of the inventive concept, there is provided a substrate treating method including locating a substrate in a spin head, and discharging a chemical to the substrate through a nozzle, a concentration of the chemical discharged from the nozzle is higher when the chemical is discharged to an outer area of the substrate rather than when the chemical is discharged to a central area of the substrate.

In accordance with another aspect of the inventive concept, there is a substrate treating method including locating a substrate in a spin head, and discharging a chemical to the substrate through a nozzle, a temperature of the chemical discharged from the nozzle is higher when the chemical is discharged to an outer area of the substrate rather than when the chemical is discharged to a central area of the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
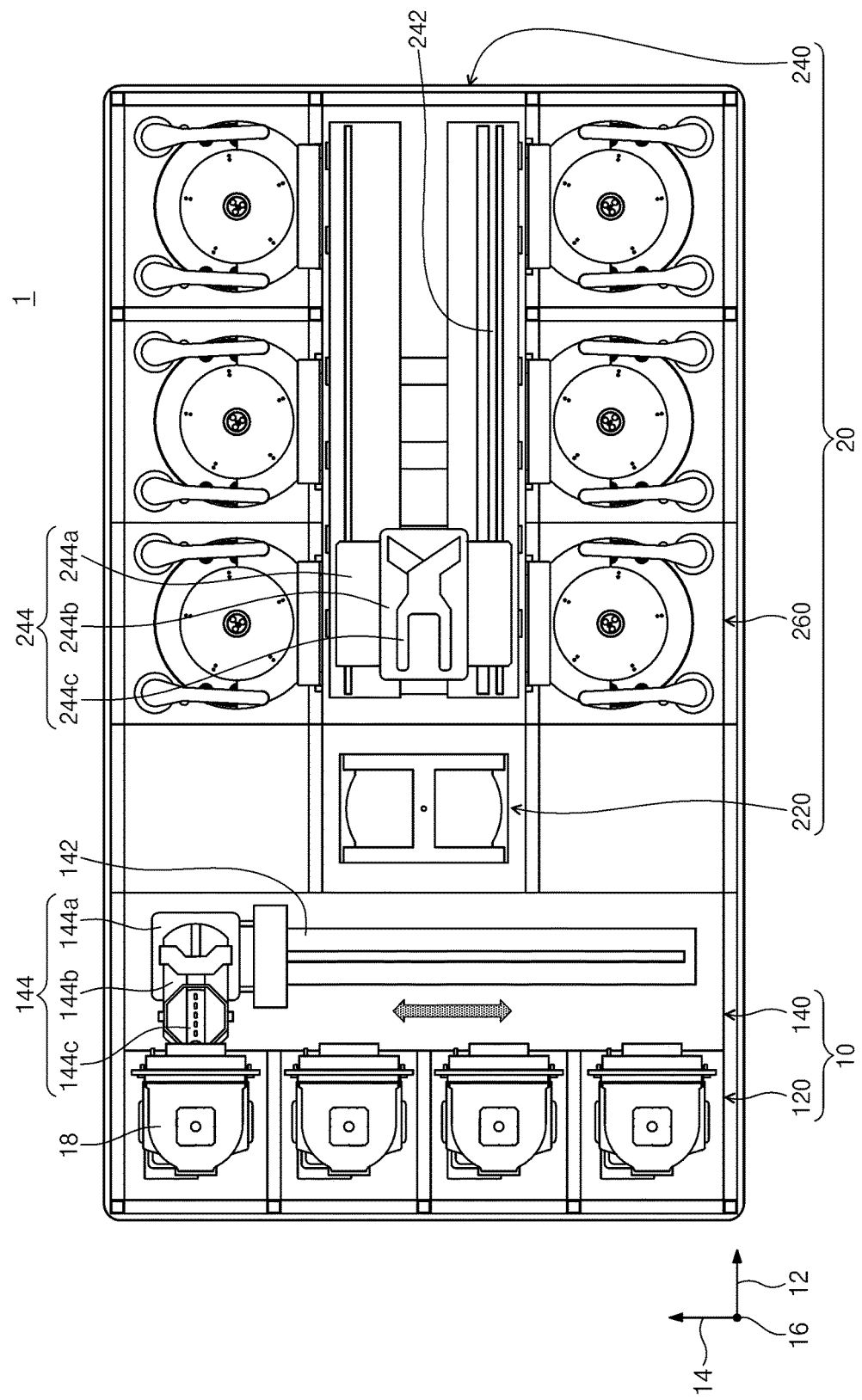
FIG. 1 is a plan view illustrating a substrate treating system according to the inventive concept.

FIG. 1 is a plan view illustrating a substrate treating system according to the inventive concept.

Referring to FIG. 1, the substrate treating system 1 includes an index module 10 and a process executing module 20.

The index module 10 includes a plurality of load ports 120 and a feeding frame 140. The load port 120, the feeding frame 140, and the process executing module 20 may be sequentially arranged. Hereinafter, a direction in which the load port 120, the feeding frame 140, and the process executing module 20 are arranged will be referred to a first direction 12. A direction perpendicular to the first direction 12 when viewed from the top will be referred to as a second direction 14, and a direction normal to a plane including the first direction 12 and the second direction 14 will be referred to as a third direction 16.

A carrier 130, in which a substrate W is received, is seated on the load port 120. A plurality of load ports 120 are provided, and are disposed along the second direction 14 in a row. FIG. 1 illustrates that four load ports 120 are provided. However, the number of the load ports 120 may increase or decrease according to a condition, such as the process efficiency of the process executing module 20 or a footprint. A plurality of slots (not illustrated) provided to support peripheries of substrates W are formed in the carrier 130. A plurality of slots are provided in the third direction 16. The substrates W are stacked in the carrier 130 while being spaced apart from each other along the third direction 16. A front opening unified pod (FOUP) may be used as the carrier 130.

The process executing module 20 includes a buffer unit 220, a feeding chamber 240, and a plurality of process chambers 260. The feeding chamber 240 is disposed such that the lengthwise direction thereof is in parallel to the first direction 12. The process chambers 260 are disposed on opposite sides of the feeding chamber 240 along the second direction 14. Some of the process chambers 260 are disposed along the lengthwise direction of the feeding chamber 240. Furthermore, some of the process chambers 260 are disposed to be stacked on each other. That is, the process chambers 260 having an array of A by B (A and B are natural numbers) may be disposed on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is disposed between the feeding frame 140 and the feeding chamber 240. The buffer unit 220 provides a space in which the substrates W stay before being transported, between the feeding chamber 240 and the feeding frame 140. Slots (not illustrated) in which the substrates W are positioned are provided in the buffer unit 220, and a plurality of slots (not illustrated) are provided to be spaced apart from each other along the third direction 16. Faces of the buffer unit 220 that faces the feeding frame 140 and faces the feeding chamber 240 are opened.

The feeding frame 140 transports the substrates W between the carrier 130 seated on the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are disposed to be stacked so as to be spaced apart from each other along the third direction 16. Some of the index arms 144c are used when the substrates W are transported to the carrier 130 in the process executing module 20, and some of the index arms 155 may be used when the substrates W are transported from the carrier 130 to the process executing module 20. This structure may prevent particles generated from the substrates W before the process treatment from being attached to the substrates W after the process treatment in the process of carrying the substrates Win and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is disposed such that the lengthwise direction thereof is in parallel to the first direction 12. The main robot 244 is installed on the guide rail 242, and is linearly moved along the first direction 12 on the index rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are disposed to be stacked so as to be spaced apart from each other along the third direction 16. The main arms 244c used when the substrates W are transported from the buffer unit 220 to the process chambers 260 and the main arms 244c used when the substrates W are transported from the process chambers 260 to the buffer unit 220 may be different.

A substrate treating apparatus for treating a substrate W with a chemical is provided in the process chamber 260. The substrate treating apparatuses provided in the process chambers 260 may have different structures according to the types of performed processes. Selectively, the substrate treating apparatuses in the process chambers 260 may have the same structure. Selectively, the process chambers 260 may be classified into a plurality of groups such that the structures of the substrate treating apparatuses in the process chambers 260 pertaining to the same group are the same and the structures of the substrate treating apparatuses in the process chambers 260 pertaining to different groups are different. For example, when the process chambers 260 are classified into two groups, the first group of process chambers 260 may be provided on one side of the feeding chamber 240 and the second group of process chambers 260 may be provided on an opposite side of the feeding chamber 240. Selectively, the first group of process chambers 260 may be provided on the lower side of the feeding chamber 240 and the second group of process chambers 260 may be provided on the upper side of the feeding chamber 240, on opposite sides of the feeding chamber 240. The first group of process chambers 260 and the second group of process chambers 260 may be classified according to the kinds of the used chemicals or the types of process methods.

Figure 2:
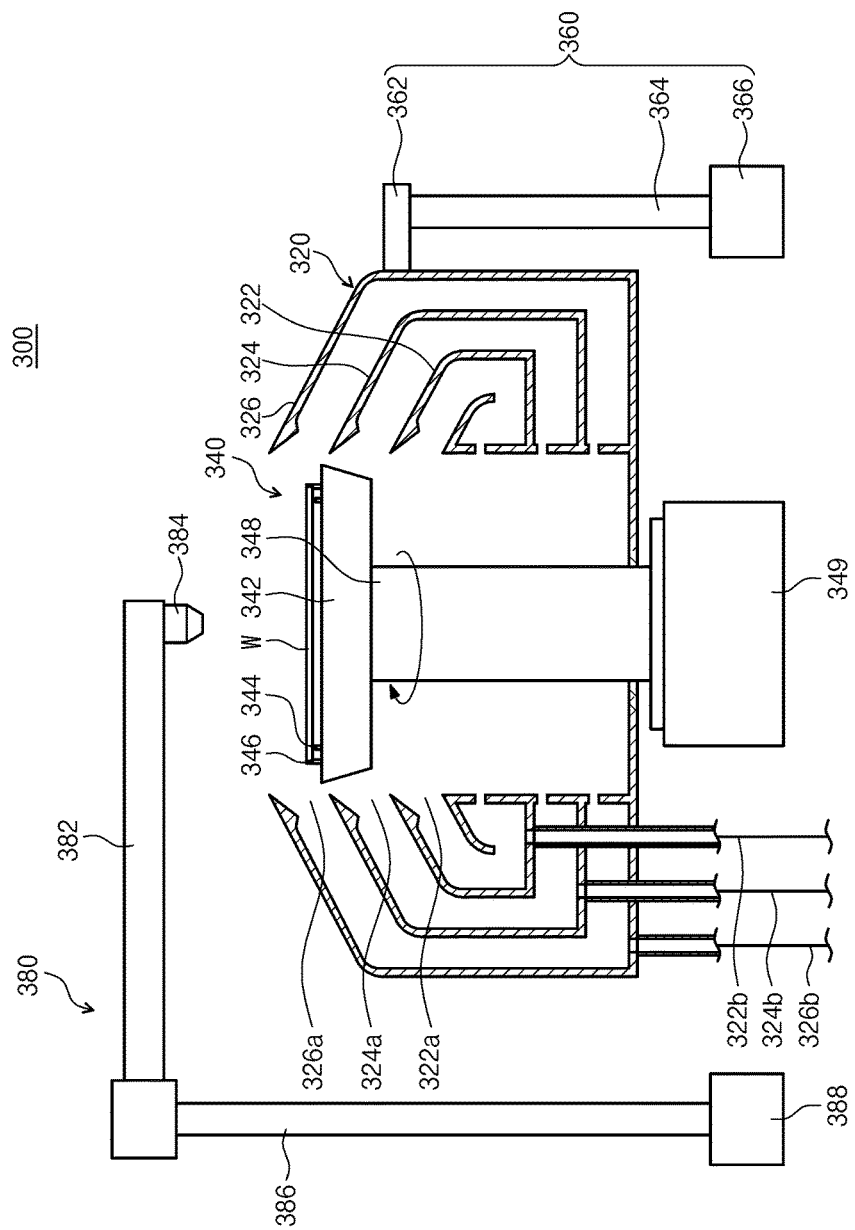
FIG. 2 is a sectional view illustrating an example of a substrate treating apparatus provided one or more of process chambers.

FIG. 2 is a sectional view illustrating an example of a substrate treating apparatus provided one or more of process chambers.

Referring to FIG. 2, the substrate treating apparatus 300 includes a cup 320, a spin head 340, an elevation unit 360, an ejection member 380, and a controller 390. The cup 320 has a space for performing a substrate treating process, and an upper side of the cup 320 is opened. The cup 320 has an inner recovery vessel 322, an intermediate recovery vessel 324, and an outer recovery vessel 326. The recovery vessels 322, 324, and 326 recover different treatment liquids used in the process. The inner recovery vessel 322 has an annular ring shape that surrounds the spin head 340, the intermediate recovery vessel 324 has an annular ring shape that surrounds the inner recovery vessel 322, and the outer recovery vessel has an annular ring shape that surrounds the intermediate recovery vessel 324. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets through which the treatment liquids are introduced into the inner recovery vessel 322, the intermediate recovery vessel 324, and the outer recovery vessel 326. Recovery lines 322b, 324b, and 326b extending from the recovery vessels 322, 324, and 326 perpendicularly in the downward direction of the bottom surfaces thereof are connected to the recovery vessels 322, 324, and 326, respectively. The recovery lines 322b, 324b, and 326b discharge the treatment liquids introduced through the recovery vessels 322, 324, and 326, respectively. The discharged treatment liquids may be reused through an external treatment liquid recycling system (not illustrated).

The support unit 340 is disposed in the cup 320. The spin head 340 supports and rotates the substrate during the process. The spin head 340 has a body 342, a plurality of support pins 344, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342. A plurality of support pins 344 are provided. The support pins 344 may be arranged to be spaced apart from each other at a periphery of the upper surface of the body 342 and protrude upwards from the body 342. The support pins 344 are arranged to have a generally annular ring shape through combination thereof. The support pins 344 support a periphery of a rear surface of the substrate W such that the substrate W is spaced apart from the upper surface of the body 342 by a predetermined distance. A plurality of chuck pins 346 are provided. The chuck pins 346 are disposed to be more distant from the center of the body 342 than the support pins 344. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate at the support position.

The elevation unit 360 linearly moves the cup 320 upwards and downwards. When the cup 320 moves upwards and downwards, a relative height of the cup 320 to the spin head 340 is changed. The elevation unit 360 has a bracket 362, a movable shaft 364, and a driver 366. The bracket 362 is fixedly installed on an outer wall of the cup 320, and the movable shaft 364 that is moved upwards and downwards by the driver 366 is fixedly coupled to the bracket 362. The cup 320 is lowered such that, when the substrate W is positioned on the spin head 340 or is lifted from the spin head 340, the spin head 340 protrudes to the upper side of the cup 320. When the process is performed, the height of the cup 320 is adjusted such that the treatment liquid is introduced into the preset recovery vessels 322, 324, and 326 according to the kind of the treatment liquid supplied to the substrate W. For example, the substrate is located at a height corresponding to an interior space 322a of the inner recovery vessel 322 while the substrate is treated by a first treatment liquid. Further, the substrate may be located at a height corresponding to a space 324a between the inner recovery vessel 322 and the intermediate recovery vessel 324 and a space 326a between the intermediate recovery vessel 324 and the outer recovery vessel 326 while the substrate is treated by a second treatment liquid and a third treatment liquid. Unlike those described above, the elevation unit 360 may move the spin head 340, instead of the cup 320, upwards and downwards.

The ejection member 380 supplies a chemical to the substrate W during a substrate treating process. The injection member 380 has a nozzle support 382, a nozzle 384, a support shaft 386, and a driver 388. The lengthwise direction of the support shaft 386 is provided along the third direction 16, and the driver 388 is coupled to a lower end of the support shaft 386. The driver 388 rotates and elevates the support shaft 386. The nozzle support 382 is vertically coupled to an end that is opposite to an end of the support shaft 386 coupled to the driver 386. The nozzle 384 is installed on the bottom surface of an end of the nozzle support 382. The nozzle 384 is moved to a process location and a standby location by the driver 388. A process location is a vertically upward area of the spin head 340 such that the nozzle 384 discharges a treatment liquid to the substrate W. A standby location is a location that the nozzle 384 deviates towards an outside of the vertically upward area of the spin head 340.

Figure 3:
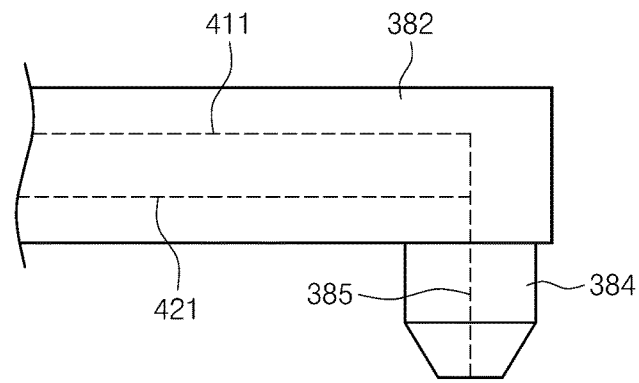
FIG. 3 is a view illustrating a piping structure connected to a nozzle.

FIG. 3 is a view illustrating a piping structure connected to a nozzle.

Referring to FIG. 3, the discharge passage 385 extends to an end of the nozzle 384, and supplies the chemical, which is to be discharged, to the nozzle 384. The discharge passage 385 is connected to a first passage 411 and a second passage 421. The first passage 411 supplies a first chemical to the discharge passage 385, and the second passage 421 supplies a second chemical to the discharge passage 385. Accordingly, the nozzle 384 may discharge the first chemical or the second chemical, or may mix the first chemical and the second chemical and discharge the mixture.

Figure 4:
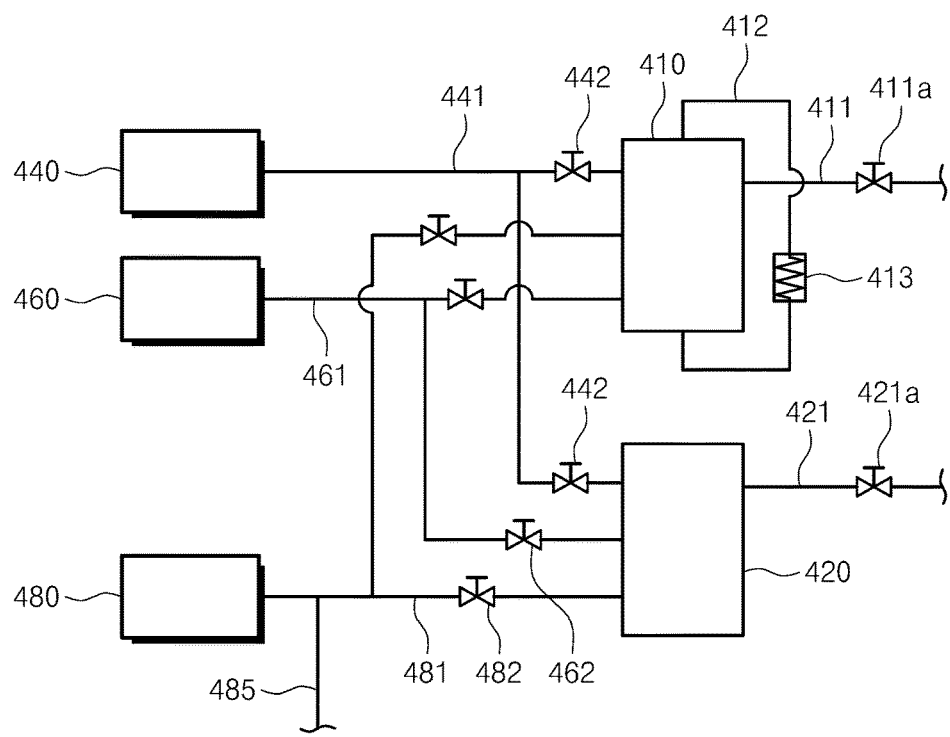
FIG. 4 is a view illustrating a chemical supply unit connected to a first passage and a second passage.

FIG. 4 is a view illustrating a chemical supply unit connected to a first passage and a second passage.

Referring to FIG. 4, the chemical supply unit 400 includes a first tank 410, a second tank 420, a chemical supplementing tank 440, a concentration adjusting tank 460, and an auxiliary supplementing tank 480.

The first tank 410 stores the first chemical. The first tank 410 is connected to the first passage 411 to supply the first chemical to the ejection member 380 through the first passage 411. The first passage 411 may be provided with a first valve 411a that may open and close a pipe line or adjust a flow rate of the first chemical. A circulation passage 412 may be connected to the first tank 410. The circulation passage 412 may be provided such that opposite ends of the circulation passage 412 are directly connected to the first tank 410 or one end of the circulation passage 412 is branched from the first passage 411 and an opposite end of the circulation passage 412 is directly connected to the first tank 410. The first chemical discharged from the first tank 410 to one end of the circulation passage 412 or the first passage 411 may circulate to be introduced to the first tank 410 again through the circulation passage 412. A heater 413 may be located in the circulation passage 412. The heater 413 heats the first chemical flowing through the circulation passage 412.

The second tank 420 stores the second chemical. The second tank 420 is connected to the second passage 421 to supply the second chemical to the ejection member 380 through the second passage 421. The second passage 421 may be provided with a second valve 421a that may open and close a pipe line or adjust a flow rate of the second chemical. The second chemical has the same chemical composition as the first chemical. A temperature, a concentration, or a temperature and a concentration of the second chemical supplied to the ejection member 380 are lower than those of the first chemical.

The chemical supplementing tank 440 is connected to the first tank 410 and the second tank 420 through the chemical supplementing passage 441. If an amount of the first chemical stored in the first tank 410 is a preset value or less, the chemical supplementing tank 440 may supply the chemical to the first tank 410. Further, if an amount of the second chemical stored in the second tank 420 is a preset value or less, the chemical supplementing tank 440 may supply the chemical to the second tank 420. The chemical supplementing passage 441 may be provided with a valve 442 that may open and close portions of the chemical supplementing passage 441, which are connected to the first tank 410 and the second tank 420 or may adjust a flow rate of the chemicals.

The concentration adjusting tank 460 is connected to the first tank 410 and the second tank 420 through a supplementary liquid supplementing passage 461. If an amount of the first chemical stored in the first tank 410 is a preset value or less, the concentration adjusting tank 460 may supply the supplementary liquid to the first tank 410. Further, if an amount of the second chemical stored in the second tank 420 is a preset value or less, the concentration adjusting tank 460 may supply the supplementary liquid to the second tank 420. The supplementary liquid may be pure water. The supplementary liquid supplementing passage 461 may be provided with a valve 462 that may open and close portions of the auxiliary liquid supplementing passage 461, which are connected to the first tank 410 and the second tank 420 or may adjust a flow rate of the chemicals. The chemical supplied from the chemical supplementing tank 440 to the first tank 410 is changed to a first chemical directly or after being mixed with a preset amount of the supplementary liquid supplied from the concentration adjusting tank 460. The chemical supplied from the chemical supplementing tank 440 to the second tank 420 is changed to a second chemical after being mixed with a preset amount of the supplementary liquid supplied from the concentration adjusting tank 460. Accordingly, the chemical composition of the second chemical is the same as that of the first chemical, but the concentrations of the first chemical and the second chemical may be different.

The auxiliary supplementing tank 480 is connected to the first tank 410 and the second tank 420 through an auxiliary supplementing passage 481. The auxiliary supplementing tank 480 supplies a chemical to the first tank 410 and the second tank 420. Both or one of the chemical supplementing tank 440 and the auxiliary supplementing tank 480 may supply the chemical to the first tank 410. Further, both or one of the chemical supplementing tank 440 and the auxiliary supplementing tank 480 may supply the chemical to the second tank 420. The auxiliary supplementing passage 481 may be provided with a valve 482 that may open and close portions of the auxiliary supplementing passage 441, which are connected to the first tank 410 and the second tank 420 or may adjust a flow rate of the chemicals. A recycling line 485 may be connected to the auxiliary supplementing passage 481. The chemical recovered through recovery lines 322b, 324b, and 326b, or one of them may be supplied through the recycling line 485 after being treated by a recycling system. The chemical supplied through the recycling line 485 may flow to the auxiliary supplementing tank 480 to be stored, or may be supplied to the first tank 410 or the second tank 420. Further, the recycling line 485 may be directly connected to the auxiliary supplementing tank 480.

Hereinafter, a process of discharging a chemical to the substrate W by using the ejection member 380 will be described.

If the substrate W is located in the spin head 340, the ejection member 380 discharges the chemical to the substrate W. When the chemical is discharged to the substrate W, the substrate W is provided while being rotated. Accordingly, the chemical discharged to the substrate W flows to the outside of the substrate W with a centrifugal force. Accordingly, differences between time points at which the chemical is initially applied to areas of the substrate W and times for which the areas of the substrate W are exposed to the chemical occur. Further, as the centrifugal forces of the substrate W due to the rotation of the substrate W are different for the areas of the substrate W and the circumferences of the substrate W increases as it goes to the outside, the amounts of the chemical applied to the areas of the upper surface of the substrate W may become different. The phenomenon makes the treatment degrees of the areas of the substrate W by the chemical different.

Further, the treatment degrees of the substrate W by the chemical become different according to the state of the chemical. As an example, when the other conditions are the same, the treatment degree of the substrate W may increase if the concentration of the chemical applied to the substrate W increases. Further, when the other conditions are the same, the treatment degree of the substrate W may increase if the temperature of the chemical applied to the substrate W increases. Accordingly, the treatment quality of the substrate W is improved by adjusting the temperatures or concentrations of the chemical applied to different area of the substrate W.

The nozzle 384 discharges the chemical to the substrate W while moving between a central area and an outer area of the substrate one time or more. The movement path of the nozzle 384 may pass above the center of rotation of the substrate W. As an example, the ejection member 380 may make the temperature of the chemical discharged from the nozzle 384 higher at an outer area of the substrate W rather than at a central area of the substrate W. The nozzle 384 may discharge a chemical obtained by mixing the first chemical and the second chemical, or a chemical including only the second chemical to the central area of the substrate W. Further, when the chemical is discharged to the central area of the substrate W rather than when the nozzle 384 discharges the chemical to the outer area of the substrate W, the temperature of the chemical may be increased by making the amount of the first chemical supplied to the first passage 411 large, making the amount of the second chemical supplied to the second passage 421 small, making the amount of the first chemical supplied to the first passage 411 large, and making the amount of the second chemical supplied to the second passage 421 small.

As another example, the ejection member 380 may make the concentration of the chemical discharged from the nozzle 384 higher at an outer area of the substrate W rather than at a central area of the substrate W. The nozzle 384 may discharge a chemical obtained by mixing the first chemical and the second chemical, or a chemical including only the second chemical to the central area of the substrate W. Further, when the chemical is discharged to the central area of the substrate W rather than when the nozzle 384 discharges the chemical to the outer area of the substrate W, the concentration of the chemical may be increased by making the amount of the first chemical supplied to the first passage 411 large, making the amount of the second chemical supplied to the second passage 421 small, making the amount of the first chemical supplied to the first passage 411 large, and making the amount of the second chemical supplied to the second passage 421 small.

As another example, in a similar method, the ejection member 380 may increase the concentration and the temperature of the chemical discharged from the nozzle 384 in the outer area of the substrate rather than in the central area of the substrate.

According to an embodiment of the inventive concept, a substrate treating apparatus that efficiently treats a substrate and a substrate treating method may be provided.

Further, according to an embodiment of the inventive concept, a substrate treating apparatus that uniformly treats different areas of a substrate by using a chemical and a substrate treating method may be provided.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
   a spin head configured to support the substrate;
   a nozzle configured to discharge a chemical to the substrate located on the spin head;
   a first passage configured to supply a first chemical, a chemical composition of which is the same as the chemical;
   a second passage configured to supply a second chemical, a chemical composition of which is the same as the first chemical;
   a discharge passage connecting the first passage and the second passage, and the nozzle;
   a first tank connected to the first passage and configured to supply the first chemical to the first passage;
   a second tank connected to the second passage and configured to supply the second chemical to the second passage;
   a circulation passage connected with the first tank and through which the first chemical discharged from the first tank is returned into the first tank, wherein the circulation passage is not physically connected with the second tank;
   a heater connected with the circulation passage; and
   an auxiliary supplementing tank connected with each of the first tank and the second tank, the auxiliary supplementing tank configured to provide each of the first tank and the second tank with the chemical.

2. The substrate treating apparatus of claim 1, wherein a concentration of the first chemical is higher than that of the second chemical.

3. The substrate treating apparatus of claim 1, wherein a temperature of the first chemical is higher than that of the second chemical.

4. The substrate treating apparatus of claim 1, wherein a temperature of the first chemical is higher than a temperature of the second chemical, and the first tank supplies a larger amount of the first chemical to the nozzle when the nozzle discharges the chemical to an outer area of the substrate rather than when the nozzle discharges the chemical to a central area of the substrate.

5. The substrate treating apparatus of claim 1, wherein a concentration of the first chemical is higher than a concentration of the second chemical, and the first tank supplies a larger amount of the first chemical to the nozzle when the nozzle discharges the chemical to an outer area of the substrate rather than when the nozzle discharges the chemical to a central area of the substrate.

6. The substrate treating apparatus of claim 1, wherein the first tank is connected with the second tank.

7. A substrate treating apparatus comprising:
   a spin head;
   a nozzle configured to discharge a chemical toward the spin head;
   a first passage configured to supply a first chemical toward the spin head, a chemical composition of which is the same as the chemical;
   a second passage configured to supply a second chemical toward the spin head, a chemical composition of which is the same as the chemical;
   a discharge passage connecting the first passage, the second passage and the nozzle, wherein the nozzle is configured to discharge the first and second chemicals at a same time;
   a first tank connected to the first passage and configured to supply the first chemical to the first passage;
   a second tank connected to the second passage and configured to supply the second chemical to the second passage;
   a circulation passage including a first end connected with a first side of the first tank and a second end connected with a second side of the first tank, wherein the circulation passage is not physically connected with the second tank;

a heater connected with the circulation passage; and an auxiliary supplementing tank connected with each of the first tank and the second tank, the auxiliary supplementing tank configured to provide each of the first tank and the second tank with the chemical.

8. The substrate treating apparatus of claim 7, wherein a concentration of the first chemical is higher than that of the second chemical.

9. The substrate treating apparatus of claim 7, wherein a temperature of the first chemical is higher than that of the second chemical.

10. The substrate treating apparatus of claim 7, wherein a temperature of the first chemical is higher than a temperature of the second chemical, and the first tank supplies a larger amount of the first chemical to the nozzle when the nozzle discharges the chemical to an outer area of the substrate rather than when the nozzle discharges the chemical to a central area of the substrate.

11. The substrate treating apparatus of claim 7, wherein a concentration of the first chemical is higher than a concentration of the second chemical, and the first tank supplies a larger amount of the first chemical to the nozzle when the nozzle discharges the chemical to an outer area of the substrate rather than when the nozzle discharges the chemical to a central area of the substrate.

12. A substrate treating apparatus comprising:
a spin head;
a nozzle configured to discharge a chemical to the substrate located on the spin head;
a first passage configured to supply a first chemical to the substrate, a chemical composition of which is the same as the chemical;
a second passage configured to supply a second chemical to the substrate, a chemical composition of which is the same as the chemical;
a discharge passage connecting the first passage, the second passage and the nozzle;
a first tank connected to the first passage and configured to supply the first chemical to the first passage;
a second tank connected to the second passage and configured to supply the second chemical to the second passage;
a circulation passage including a first end connected with a first side of the first tank and a second end connected with a second side of the first tank, wherein the circulation passage is not physically connected with the second tank;
a heater connected with the circulation passage between the first end of the circulation passage and the second end of the circulation passage; and
an auxiliary supplementing tank connected with each of the first tank and the second tank, the auxiliary supplementing tank configured to provide each of the first tank and the second tank with the chemical.

13. The substrate treating apparatus of claim 12, wherein a concentration of the first chemical is higher than that of the second chemical.

14. The substrate treating apparatus of claim 12, wherein a temperature of the first chemical is higher than that of the second chemical.

15. The substrate treating apparatus of claim 12, wherein a temperature of the first chemical is higher than a temperature of the second chemical, and the first tank supplies a larger amount of the first chemical to the nozzle when the nozzle discharges the chemical to an outer area of the substrate rather than when the nozzle discharges the chemical to a central area of the substrate.

16. The substrate treating apparatus of claim 12, wherein a concentration of the first chemical is higher than a concentration of the second chemical, and the first tank supplies a larger amount of the first chemical to the nozzle when the nozzle discharges the chemical to an outer area of the substrate rather than when the nozzle discharges the chemical to a central area of the substrate.

17. The substrate treating apparatus of claim 12, further comprising a valve positioned along the first passage between the first tank and the discharge passage.

* * * * *